(12) United States Patent
Verma et al.

(10) Patent No.: US 10,387,593 B2
(45) Date of Patent: Aug. 20, 2019

(54) CODE COVERAGE RECONSTRUCTION

(71) Applicant: Mentor Graphics Corporation, Wilsonville, OR (US)

(72) Inventors: Gaurav Kumar Verma, Fremont, CA (US); Doug Warmke, Cupertino, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/630,345

(22) Filed: Feb. 24, 2015

(65) Prior Publication Data
US 2016/0246913 A1 Aug. 25, 2016

(51) Int. Cl.
*G06F 17/50* (2006.01)
*G06F 8/41* (2018.01)

(52) U.S. Cl.
CPC .......... *G06F 17/5022* (2013.01); *G06F 8/41* (2013.01)

(58) Field of Classification Search
USPC ........................................................ 716/106
See application file for complete search history.

(56) References Cited

U.S. PATENT DOCUMENTS

2010/0070940 A1* 3/2010 Bist ............... G06F 17/5022
716/106

* cited by examiner

*Primary Examiner* — Eric D Lee
(74) *Attorney, Agent, or Firm* — Mentor Graphics Corporation

(57) ABSTRACT

This application discloses a computing system configured to divide bins into primary bins and secondary bins based, at least in part, on a configuration of a circuit design describing an electronic device. The computing system can utilize the primary bins to record coverage events performed by the electronic device when modeled in a verification environment by the computing system, and infer coverage event records for the secondary bins based, at least in part, on the coverage event records for the primary bins.

20 Claims, 7 Drawing Sheets

STATEMENT COVERAGE EXAMPLE

| COVERAGE BINS 701 | CODE 702 |
|---|---|
| PRIMARY BIN | always @(posedge clk) begin |
| SECONDARY BIN | l = addr; |
| SECONDARY BIN | rdy_r = 1; |
| SECONDARY BIN | mem[i] = data; |
| SECONDARY BIN | data_r = 'bz; |
| | end |

FIG. 7

BRANCH AND STATEMENT COVERAGE EXAMPLE

| COVERAGE BINS 801 | CODE 802 |
|---|---|
| PRIMARY BIN | if (condition) begin |
| SECONDARY BIN | $root.top.myvar = 4'b1010; |
| SECONDARY BIN | addr = 'bz; |
| SECONDARY BIN | $display("%b", $root.top.myvar); |
| | end |
| PRIMARY BIN | else begin |
| SECONDARY BIN | $root.top.myvar = 4'b0000; |
| SECONDARY BIN | addr = 'b0; |
| SECONDARY BIN | $display("%b", $root.top.myvar); |
| | end |

FIG. 8

CODE COVERAGE RECONSTRUCTION

TECHNICAL FIELD

This application is generally related to electronic design automation and, more specifically, to code coverage reconstruction.

BACKGROUND

Designing and fabricating electronic systems typically involves many steps, known as a design flow. The particular steps of a design flow often are dependent upon the type of electronic system being designed, its complexity, the design team, and the fabricator or foundry that will manufacture the electronic system. The design flow typically starts with a specification for a new electronic system, which can be transformed into a logical design. The logical design can model the electronic system at a register transfer level (RTL), which is usually coded in a Hardware Design Language (HDL), such as System Verilog, Very high speed integrated circuit Hardware Design Language (VHDL), System C, or the like. The logical design of the electronic system can be analyzed to confirm that it will accurately perform the functions desired for the electronic system. This analysis is sometimes referred to as "functional verification."

Functional verification can begin with a circuit design that can be simulated by a design verification tool. The design verification tool utilizing a test bench can generate test stimulus that, when input to the simulated circuit design, can allow the design verification tool to analyze the functionality of the circuit design. The design verification tool can quantify how well a test bench came to covering or adequately exercising the simulated circuit design, for example, with various coverage types. For example, the design verification tool can use statement coverage to quantify whether each executable statement or line of code in the circuit design was executed in response to the test bench. The design verification tool can use decision coverage to quantify whether each coded decision path was utilized in response to the test bench. The design verification tool can use condition coverage to quantify whether all outcomes of a condition, for example, both true and false, were realized in response to the test bench. The design verification tool can use expression coverage to quantify whether expressions in the code of the circuit design, such as Boolean logic structures, were adequately exercised or functionally verified in response to the test bench. The design verification tool can, of course, incorporate many different coverage types, other than those discussed above.

The design verification tool can select one or more of the coverage types to monitor or collect during the simulation of the circuit design, which, in some cases, can be in response to input from a user interface. For each of the selected coverage types, the design verification tool can generate coverage bins that can record occurrences of corresponding coverage events, oftentimes by incrementing counters, during the simulation of the circuit design. For example, when statement coverage is selected, the design verification tool can generate a different coverage bin for each line of code in the circuit design. When a line of code is executed during the simulation of the circuit design, the coverage bin for that line of code can record the fact that the line of code was executed. For other coverage types, such as branch coverage, coverage events can correspond to execution of lines of code along with a presence of conditions in those lines of code.

The design verification tool, after the circuit design simulation has been completed, can gather the records associated with the coverage bins, which can be output to a storage system, such as memory system implementing a Unified Coverage Database (UCDB) or other coverage database format. The design verification tool, or other tool accessing the records in the storage system, can generate one or more coverage metrics. For example, when a statement coverage type was selected to be collected during circuit design simulation, the design verification tool can generate a statement coverage metric from the coverage bin records to quantify whether each executable statement or line of code in the circuit design was executed in response to the test stimulus generated by the test bench during circuit design simulation.

While the existing technique to collect coverage events during circuit design simulation is effective, it is often resource intensive due to all of the counters utilized by the design verification tool to record the presence of the coverage events. This utilization of resources often causes slow processing throughput, leading to longer simulation times. Furthermore, with the recent increased utilization of hardware emulators for functional verification, collection and analysis of test bench coverage during circuit design emulation is also desirable. Unfortunately, the addition of counters, and possibly associated logic, to support coverage bins is impractical given their associated utilization of the available hardware capacity.

SUMMARY

This application discloses tools and mechanisms for implementing code coverage reconstruction. According to various embodiments, the tools and mechanisms can divide bins into primary bins and secondary bins based, at least in part, on a configuration of a circuit design describing an electronic device. The tools and mechanisms can utilize the primary bins to record coverage events performed by the electronic device when modeled in a verification environment by the computing system, and infer coverage event records for the secondary bins based, at least in part, on the coverage event records for the primary bins. Embodiments of implementing code coverage reconstruction will be described in greater detail below.

DESCRIPTION OF THE DRAWINGS

FIGS. 7 and 8 illustrate example implementations of primary and secondary bin selection according to various examples of the invention.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads.

Figure 1:
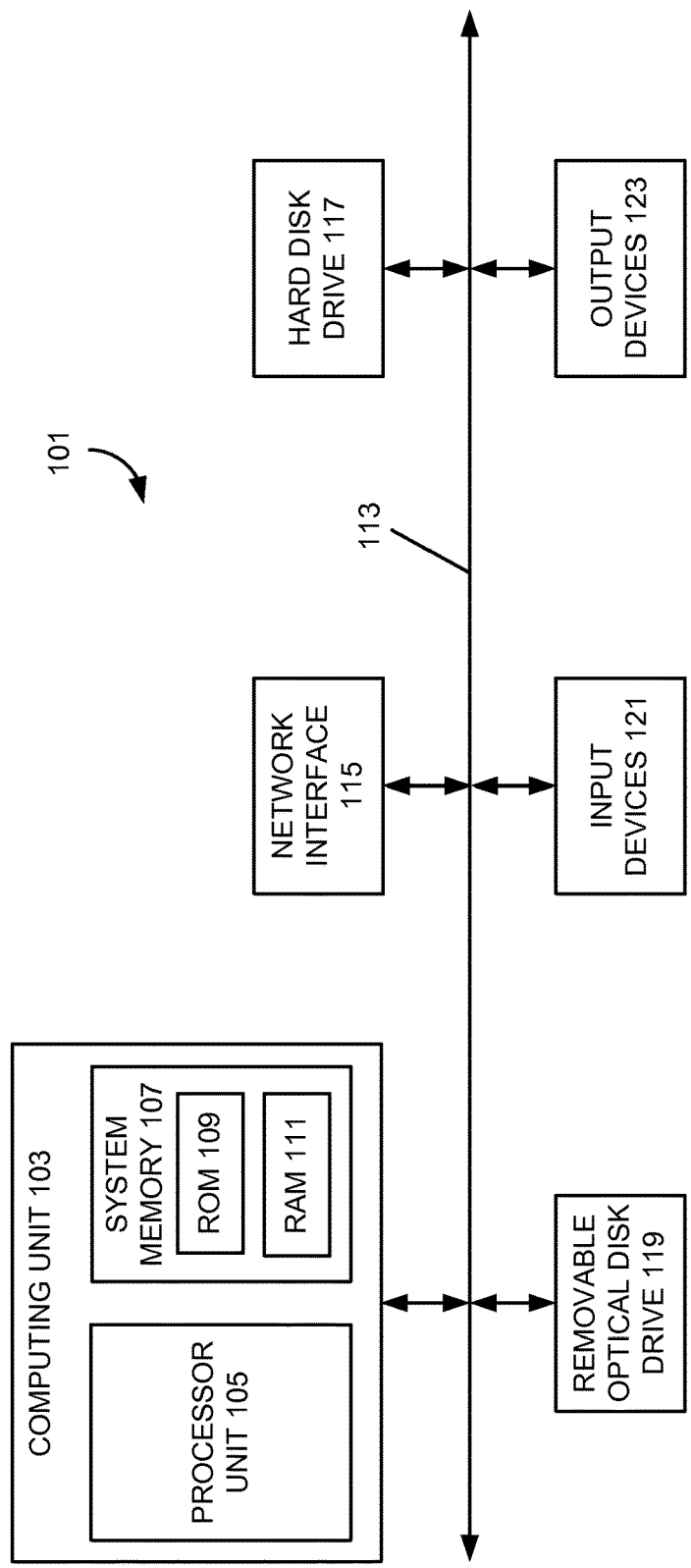
FIGS. 1 and 2 illustrate an example of a computer system of the type that may be used to implement various embodiments of the invention.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
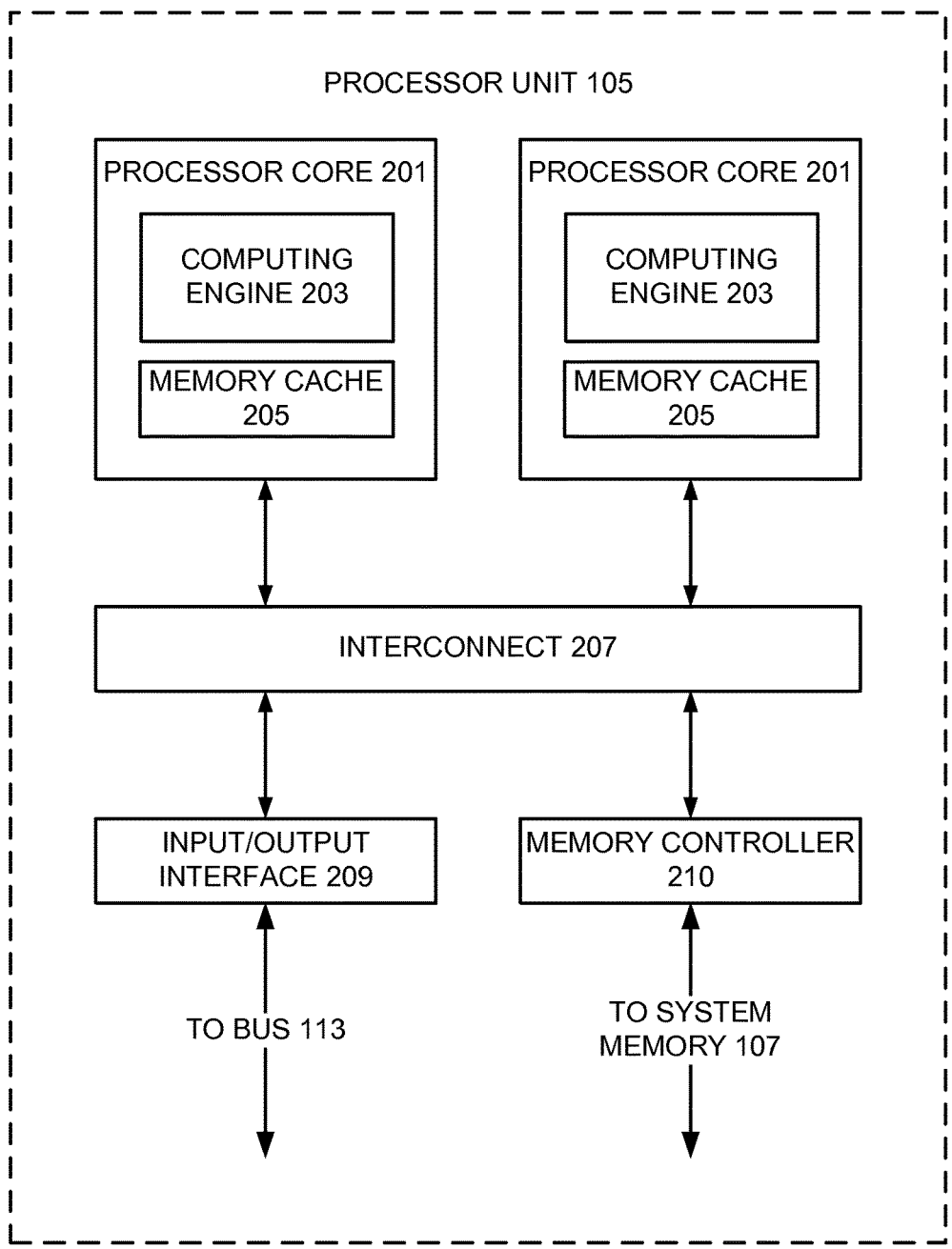

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 113. Similarly, the memory controller 211 controls the exchange of information between the processor unit 201 and the system memory 107. With some implementations of the invention, the processor units 201 may include additional components, such as a high-level cache memory accessible shared by the processor cores 201.

It also should be appreciated that the description of the computer network illustrated in FIG. 1 and FIG. 2 is provided as an example only, and it not intended to suggest any limitation as to the scope of use or functionality of alternate embodiments of the invention.

Code Coverage Reconstruction

Figure 3:
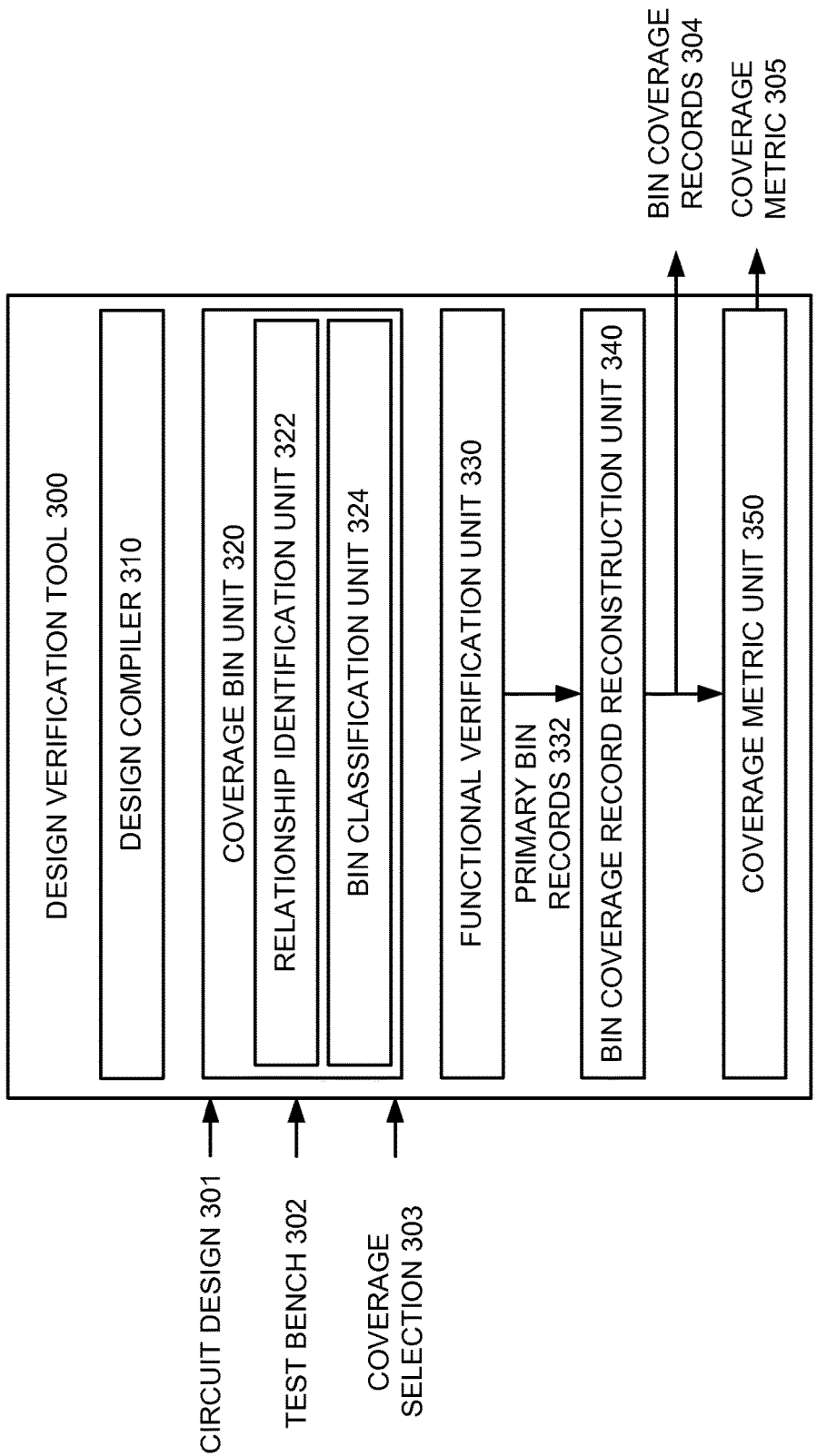
FIG. 3 illustrates an example of a design verification tool implementing code coverage reconstruction according to various embodiments of the invention.

FIG. 3 illustrates an example of a design verification tool 300 implementing code coverage reconstruction according to various embodiments of the invention. Referring to FIG. 3, the design verification tool 300 can receive a circuit design 301, which can describe an electronic device both in terms of an exchange of data signals between components in the electronic device, such as hardware registers, flip-flops, combinational logic, or the like, and in terms of logical operations that can be performed on the data signals in the electronic device. The circuit design 301 can model the electronic device at a register transfer level (RTL), for example, with code in a hardware description language (HDL), such as Very high speed integrated circuit Hardware Design Language (VHDL), System C, or the like. In some embodiments, the design verification tool 300 can receive the circuit design 301 from a source external to the design verification tool 300, such as a user interface of the computer network 101, another tool implemented by the computer network 101, or the design verification tool 300 may generate the circuit design 301 internally.

The design verification tool 300 can receive a test bench 302 capable of defining test stimuli, for example, clock signals, activation signals, power signals, control signals, and data signals that, when grouped, may form test bench transactions capable of prompting operation of the circuit design 301 in a verification environment, such as a simulation environment or an emulation environment. In some embodiments, the test bench 302 can be written in an object-oriented programming language, for example, SystemVerilog or the like. A methodology library, for example, a Universal Verification Methodology (UVM) library, an Open Verification Methodology (OVM) library, an Advanced Verification Methodology (AVM) library, a Verification Methodology Manual (VMM) library, or the like, can be utilized as a base for creating the test bench 302. In some embodiments, the design verification tool 300 can receive the test bench 302 from a source external to the design verification tool 300, such as a user interface of the computer network 101, another tool implemented by the computer network 101, or the design verification tool 300 may generate the test bench 302 internally.

The design verification tool 300 can include a design compiler 310 to compile the circuit design 301 and the test bench 302 into a format usable in a verification environment. The design verification tool 300 can include a functional verification unit 330 to implement the verification environment, which can simulate and/or emulate the circuit design 301 and the test bench 302 based on the compiled code from the design compiler 310. In some embodiments, the functional verification unit 330 can include a simulator to simulate the functional operations performed by the circuit design 301 in response to test stimulus generated by the test bench 302. The functional verification unit 330 can include a hardware emulator to emulate the circuit design 301 with programmable hardware, such as arrays of field programmable gate array (FPGA) chips, arrays of processors, a combination thereof, or the like. The functional verification unit 330 can generate waveform data corresponding to the functional operation of the circuit design 301 in the verification environment in response to test stimulus generated by the test bench 302. The design verification tool 300 (or a tool external to the design verification tool 300) can perform a functional verification of the circuit design 301, for example, by comparing the waveform data with an expected output from the circuit design 301 in response the test stimulus generated by the test bench 302.

The design verification tool 300 also can determine various types of code coverage for the test bench 302, i.e., how well the test stimulus generated by the test bench 302 exercised the functionality of the circuit design 301. The design compiler 310 can receive a coverage selection 303, for example, as input from a user interface, which can describe one or more coverage types for the design verification tool 300 to collect in the verification environment. For example, the coverage types can include statement coverage, decision coverage, condition coverage, expression coverage, or the like.

The design verification tool 300 can include a coverage bin unit 320 to generate one or more coverage bins, for example, based on the coverage types identified in the coverage selection 303. The coverage bins can be utilized by the design verification tool 300 to record occurrences of coverage events during the simulation or emulation of the circuit design 301 in the verification environment. For example, when the coverage selection 303 indicates that statement coverage was selected, the coverage bin unit 320 can generate a coverage bin for each line of code in the circuit design 301. When the functionality associated with a line of code is realized during simulation or emulation of the circuit design 301, such as when that the line of code was executed during simulation or emulation, the design verification tool 300 can record an occurrence of a statement coverage event in the coverage bin corresponding to that line of code.

The coverage bin unit 320 can include a relationship identification unit 322 to identify relationships between coverage bins for different coverage types, which could allow a record for one coverage bin to be inferred from a record for another coverage bin. In some embodiments, this relationship between coverage bins can be an alias relationship. For example, when the circuit design 301 includes a group of code lines that, if executed during simulation or emulation, would all be executed together, the relationship identification unit 322 can determine the coverage bins corresponding to the group of code lines have an alias relationship, i.e., that records in all of the coverage bins should be identical. In some embodiments, the relationship between coverage bins can have a dependent relationship to each other, meaning a record in one coverage bin can be inferred from records of one or more other coverage bins.

The coverage bin unit 320 can include a bin classification unit 324 to utilize the relationships between coverage bins (and the coverage events recorded by the coverage bins) to classify the coverage bins as primary coverage bins or secondary coverage bins. The primary coverage bins can be active bins that, when provided to the functional verification unit 330, would be implemented to collect or record coverage events during simulation or emulation of the circuit design 301. The secondary coverage bins can be passive bins that, when provided to the functional verification unit 330, would not be implemented to collect coverage, but instead have their bin file annotated to identify a relationship to at least one primary bin and describe how a coverage record for the secondary coverage bin could be inferred from a coverage record of the related primary bin.

The functional verification unit 330 can simulate or emulate of the circuit design 301 and detect coverage events, such as execution of statements, expressions, decisions, conditions, etc., performed by the circuit design 301 in response to test stimulus generated by the test bench 302. The functional verification unit 330 can record occurrences of the coverage events in corresponding primary bins, which generates primary bin records 332. In some embodiments, the functional verification unit 330 can implement the primary bins in the verification environment with counters, for example, one counter for each of the primary bins.

The design verification tool 300 can include a bin coverage record reconstruction unit 340 to generate bin coverage records 304 from the primary bin records 322 and the annotated bin files for the secondary coverage bins. The bin coverage record reconstruction unit 340 can utilize the relationship information in the annotated bin files for the secondary coverage bins to infer records for the secondary coverage bins from the primary bin records 322. For example, when the relationship information in the annotated bin files for the secondary coverage bins indicates a secondary coverage bin has a same record as a primary bin, the bin coverage record reconstruction unit 340 can set the record for the secondary coverage bin to equal the record of the primary bin. This process of inferring secondary coverage bin records from the primary bin records 332 can continue until the bin coverage record reconstruction unit 340 generates a complete set of bin coverage records 304. The bin coverage record reconstruction unit 340 can output the bin coverage records 304. By selectively implementing the coverage bins in the verification environment and then reconstructing records of the non-implemented coverage bins, the design verification tool 300 can reduce consumption of resources, such as processing, memory, or hardware emulation resources, and increase throughput in the verification environment, while still being able to generate a full set of bin coverage records 304.

The design verification tool 300 can include a coverage metric unit 350 to generate one or more coverage metrics 305 based on the bin coverage records 304. The coverage metrics 305 can indicate which portions of the circuit design 301 were utilized in response to test stimulus generated by the test bench 302 in the verification environment. For example, the coverage metric unit 350 can determine statement, coverage decision coverage, condition coverage, expression coverage, or the like from the bin coverage records 304. Although FIG. 3 shows the coverage metric unit 350 in the design verification tool 300, in some embodiments, the coverage metric unit 350 may be included in a tool (not shown) external from the design verification tool 300.

Figure 4:
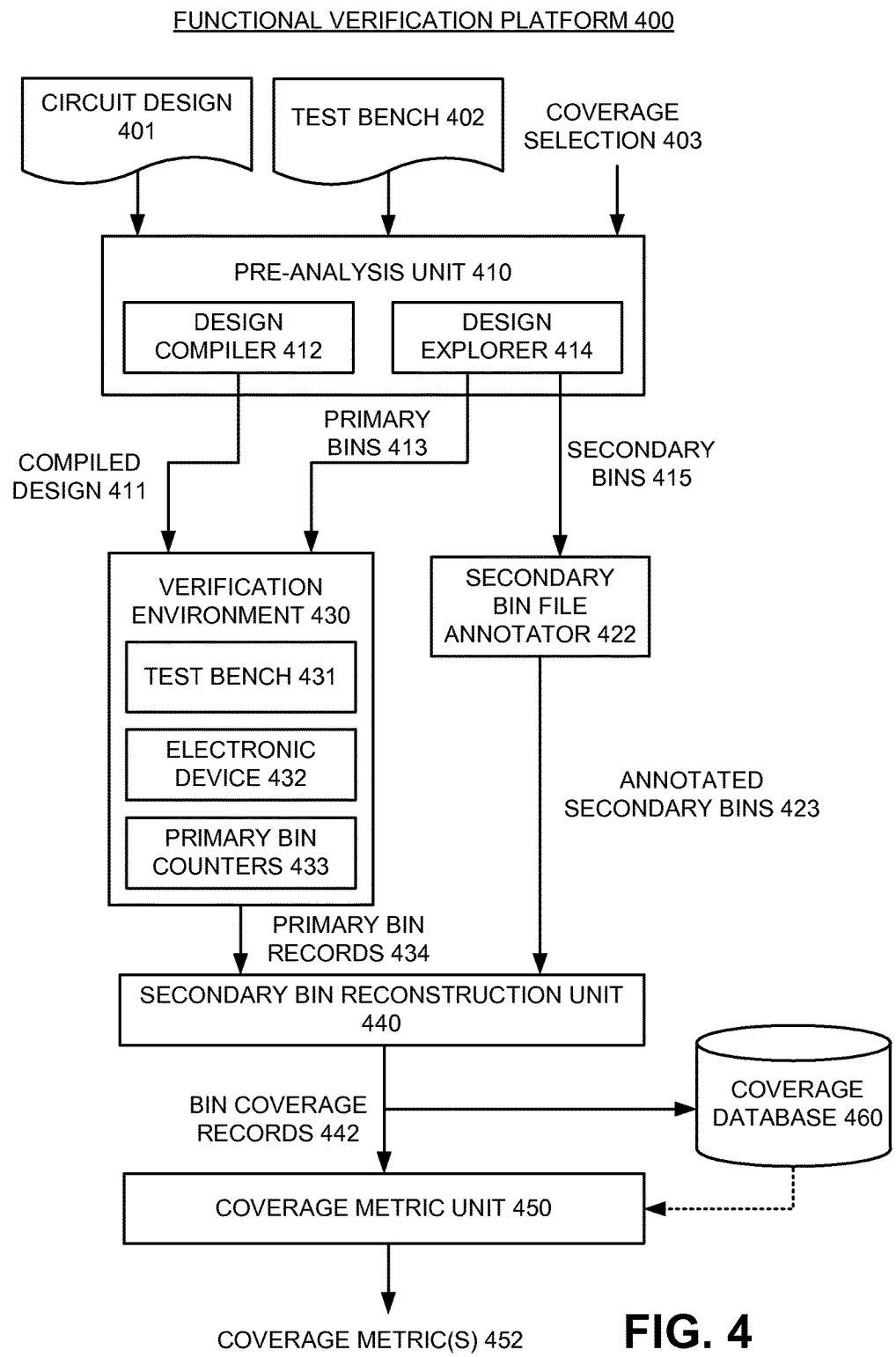
FIG. 4 illustrates an example functional verification platform that may be implemented according to various embodiments of the invention.

FIG. 4 illustrates an example functional verification platform 400 that may be implemented according to various embodiments of the invention. Referring to FIG. 4, the functional verification platform 400 can include a pre-analysis unit 410 to receive a circuit design 401, a test bench 402, and a coverage selection 403. The pre-analysis unit 410 can include a design compiler 412 to compile the circuit design 401 and the test bench 402 into a format usable in a verification environment 430, such as a compiled design 411.

The pre-analysis unit 410 also can include a design explorer 414 to generate coverage bins based, at least in part, on the coverage selection 403. The coverage selection 403 can describe one or more types of code coverage to collect with the coverage bins in the verification environment 430. For example, the coverage types can include statement coverage, decision coverage, condition coverage, expression coverage, or the like. The design explorer 414 can analyze a configuration of the circuit design 401 to determine different classifications for the coverage bins, namely, to divide the coverage bins into primary bins 413 and secondary bins 415. The primary bins 413 can be active coverage bins, i.e., implemented to collect occurrences of coverage events in the verification environment 430. The secondary bins 415 can be passive coverage bins, i.e., not implemented to collect occurrences of coverage events in the verification environment 430, but rather have their bin coverage records reconstructed based on the collected coverage records of the primary bins 413.

The verification environment 430 can simulate or emulate an electronic design 432 corresponding to the circuit design 401 and a test bench 431 corresponding to the test bench 402 based on the compiled design 411, and output waveform data corresponding to the functional operation of the electronic design 432 in response to test stimulus generated by the test bench 431. Since the functional operation of the electronic design 432 in response to test stimulus generated by the test bench 431 can correspond to various coverage events, the verification environment 430 can implement the primary bins 413, for example, as primary counters 433, which can record occurrences of coverage events corresponding to the primary bins 413. The resultant values in the primary counters 433 can correspond to primary bin records 434, which can be output from the verification environment 430.

The functional verification platform 400 can include a secondary bin file annotator 422 to modify files corresponding to the secondary bins 415 to identify relationships to the primary bins 413, and output the modified filed as annotated secondary bins 423. For example, the secondary bin file annotator 422 can insert identifiers of at least one of the primary bins 413 into the files corresponding to the secondary bins 415 and insert a description of how to convert records in the identified primary bins into records for the corresponding secondary bins. In some embodiments, the conversion can be an aliasing or copying of the record in a primary bin into a record for a corresponding secondary bin. In other embodiments, the conversion can include an alteration, combination, calculation, or the like, of record(s) in at least one primary bins to generate a record for a corresponding secondary bin.

The functional verification platform 400 can include a secondary bin reconstruction unit 440 to generate secondary bin records from the primary bin records 434 according to the annotated secondary bins 423. For example, the secondary bin reconstruction unit 440 can parse the annotated secondary bins 423 to identify, for each secondary bin 415, one or more corresponding primary bins 415 and how to manipulate primary bin records 434 associated with the identified primary bins 415 to generate the secondary bin records. In some embodiments, the secondary bin reconstruction unit 440 can combine the primary bin records 434 with the secondary bin records to generate bin coverage records 442. Each of the bin coverage records 442 can correspond to a coverage bin generated by the pre-analysis unit 410. The secondary bin reconstruction unit 440 can output the bin coverage records 442 to a coverage database 460, such as a Unified Coverage Database (UCDB), a Unified Coverage Interoperability Standard (UCIS) database, or the like.

The functional verification platform 400 can include a coverage metric unit 450 to generate one or more coverage metrics 452 based on the bin coverage records 442. The coverage metrics 452 can indicate which portions of the circuit design 401 were utilized in response to test stimulus generated by the test bench 402 in the verification environment 430. For example, the coverage metric unit 450 can determine statement, coverage decision coverage, condition coverage, expression coverage, or the like from the bin coverage records 442.

Figure 5:
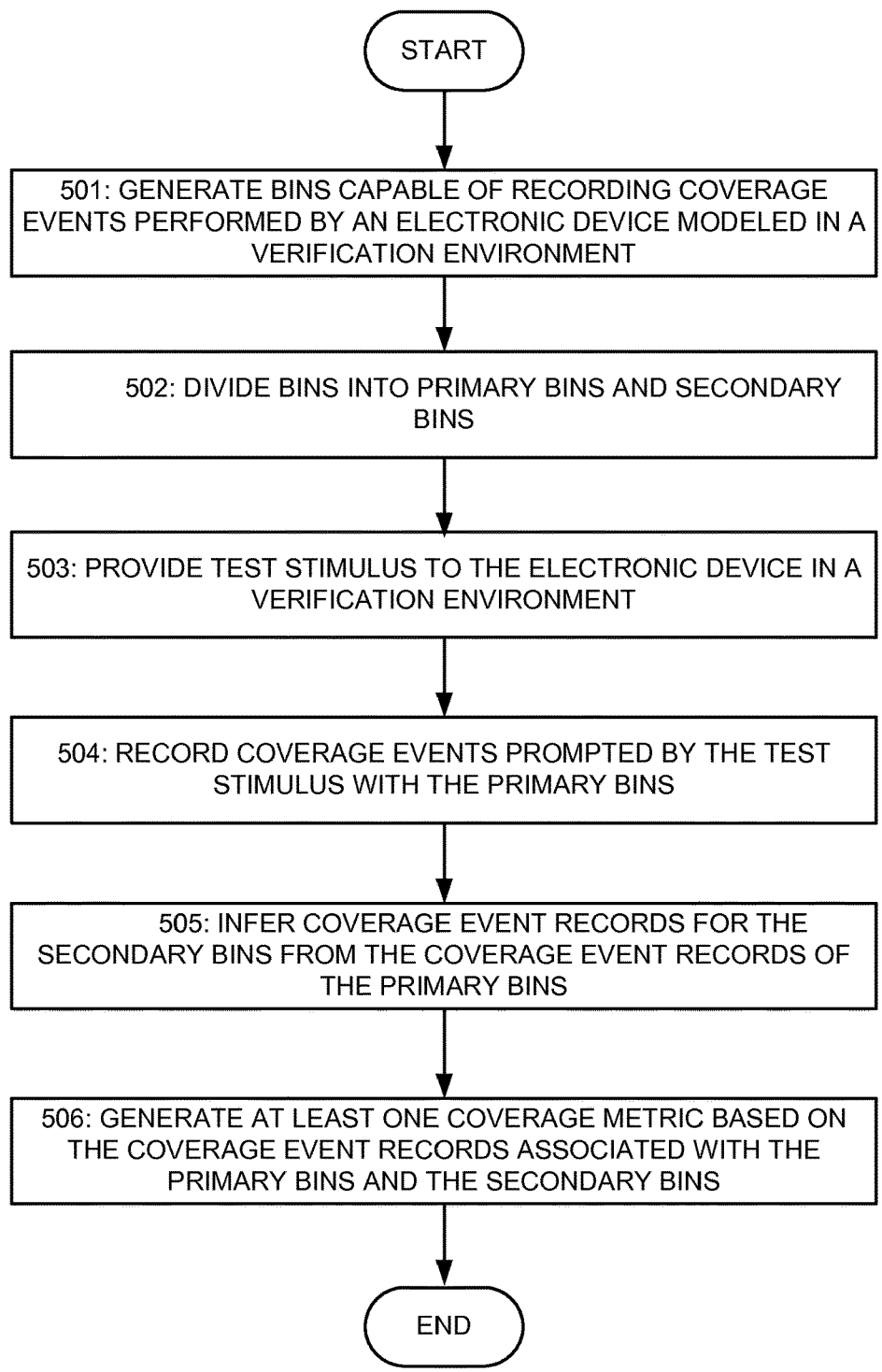
FIG. 5 illustrates a flowchart showing an example implementation of code coverage reconstruction according to various examples of the invention.

FIG. 5 illustrates a flowchart showing an example implementation of code coverage reconstruction according to various examples of the invention. Referring to FIG. 5, in a block 501, a computing system can generate bins capable of recording coverage events performed by an electronic device modeled in a verification environment. The computing system can generate different subsets of the bins to record coverage events for particular types of code coverage, such as statement coverage, decision coverage, branch coverage, expression coverage, or the like. In some embodiments, the computing system can generate the bins based on a coverage selection input identifying one or more coverage types, for example, received via a user interface.

In a block 502, the computing system can divide bins into primary bins and secondary bins. The computing system can analyze the configuration of the electronic device (or the circuit design modeling the electronic device) to identify one or more redundant bins, i.e., bins that after simulation or emulation would have a coverage record that could be inferred from coverage records in one or more other bins. The bins that can have their coverage records inferred can be classified as secondary bins, while the bins whose coverage records would be utilized by the computing system in the inferring can be classified as primary bins.

In a block 503, the computing system can provide test stimulus to the electronic device in a verification environment. In some embodiments, the computing system can implement at least a portion of the verification environment, for example, by simulating or emulating the electronic device based on the circuit design describing the electronic device. The computing system also can simulate or emulate a test bench capable of generating the test stimulus in the verification environment.

In a block 504, the computing system can record coverage events prompted by the test stimulus with the primary bins. The computing system can monitor the functionality or operation of the electronic device in the verification environment that was prompted by the test stimulus, and record those coverage events corresponding to the primary bins. In some embodiments, the primary bins can be implemented in the verification environment as counter, which can increment their value in response to occurrences of coverage events. The computing system can elect to not implement the secondary bins in the verification environment, which can conserve resources, such as processing, memory, or hardware emulation resources.

In a block 505, the computing system can infer coverage event records for the secondary bins from the coverage event records of the primary bins. The computing system can generate the coverage records for the secondary bins based on the values of the coverage records of the primary bins. In some embodiments, the computing system can convert or copy the coverage records of the primary bins based on a relationship between the primary bins and the secondary bins, which can generate the coverage records for the secondary bins.

In a block 506, the computing system can generate at least one coverage metric based on the coverage event records associated with the primary bins and the secondary bins. The coverage metric can indicate which portions of the electronic device were utilized or exercised in response to test stimulus in the verification environment. For example, the coverage metric unit can determine statement, coverage decision coverage, condition coverage, expression coverage, or the like from the coverage event records associated with the primary bins and the secondary bins.

Figure 6:
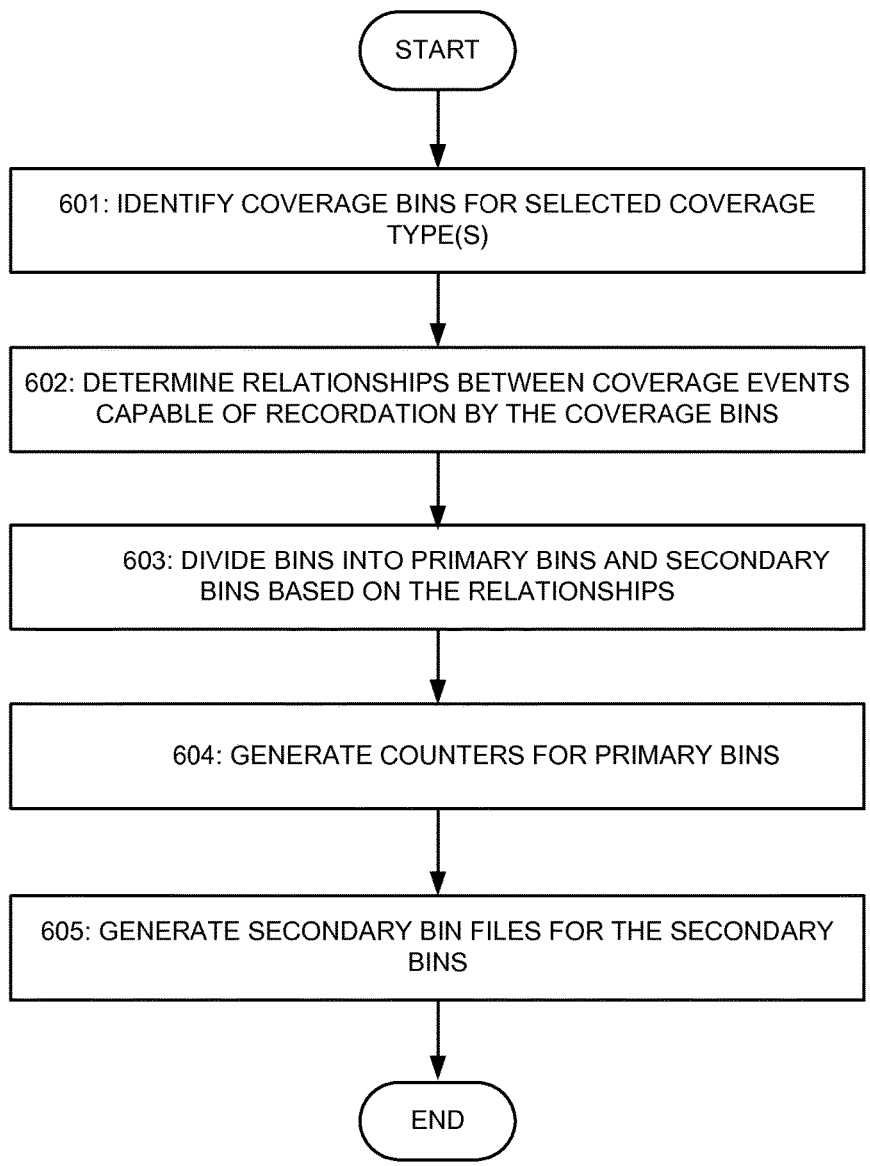
FIG. 6 illustrates a flowchart showing an example implementation of primary and secondary bin selection according to various examples of the invention.

FIG. 6 illustrates a flowchart showing an example implementation of primary and secondary bin selection according to various examples of the invention. Referring to FIG. 6, in a block 601, the computing system can identify coverage bins for selected coverage type(s) and generate one or more coverage bins for one or more selectable types of code coverage. For example, the coverage types can include statement coverage, decision coverage, condition coverage, expression coverage, or the like. The coverage bins can be utilized by the computing system to record occurrences of coverage events during the simulation or emulation of a circuit design in a verification environment.

In a block 602, the computing system can determine relationships between coverage events capable of recordation by the coverage bins, which can allow a record for one coverage bin to be inferred from a record for another coverage bin. The relationships between coverage events can be different based on different coverage types. In some embodiments, the relationship between coverage bins can be an alias relationship, e.g., that records in the coverage bins can be identical. In some embodiments, the relationship between coverage bins can have a dependent relationship to each other, meaning a record in one coverage bin can be inferred from records of one or more other coverage bins. The computing system can analyze the configuration of the circuit design to identify the relationships between coverage events and coverage bins. Examples of relationships in the configuration of the circuit design are described below in FIGS. 7 and 8.

In a block 603, the computing system can divide bins into primary bins and secondary bins based on the relationships. The primary coverage bins can be active bins that, when implemented in the verification environment, can collect or record coverage events during simulation or emulation of the circuit design. The secondary coverage bins can be passive bins that would not be implemented to collect coverage, but instead have their secondary bin files annotated to identify the relationships to the primary bins and describe how coverage records for the secondary coverage bins could be inferred from coverage records of the related primary bins.

In a block 604, the computing system can implement the primary bins in the verification environment, for example, by generating counters for primary bins. The computing system can increment the counters for the primary bins in response to occurrences of corresponding coverage events in the verification environment. In a block 605, the computing system can generate secondary bin files for the secondary bins, which can identify the relationships to the primary bins and describe how coverage records for the secondary coverage bins could be inferred from coverage records of the related primary bins FIGS. 7 and 8 illustrate example implementations of primary and secondary bin selection according to various examples of the invention. Referring to FIG. 7, an example coverage bin classification for a portion of a circuit design is shown. The portion of the circuit design can include lines of code 702, for example, written in a hardware description language, which can describe a portion of an electronic device. During simulation or emulation of the electronic device, if one of the lines of the code 702 is executed, based on the semantics of the portion of the code 702, all of the lines in the portion of the code 702, would be executed. For example, when the top line of the code 702 is executed, the subsequent lines of the code 702 will be executed, ending with bottom line of the code 702.

For statement coverage, coverage bins 701 can be generated for each executable line of the code 702. During simulation or emulation of the code 702, when a line of the code 702 is executed, resulting in a statement coverage event, a corresponding coverage bin can record the execution of that line of code as an occurrence of the statement coverage event. Since the code 702 is configured such that when one line of the code 702 is executed during simulation or emulation the other lines of the code 702 will also be executed, all of the coverage bins 701 need not be implemented to record coverage events in a verification environment. Instead, a single coverage bin can be implemented in the verification environment to record statement coverage events, while the other coverage bins can have their coverage event records generated from coverage event record of the implemented coverage bin.

In this example, the coverage bin corresponding to the top line of the code 702 can be classified as a primary bin, meaning that it will be implemented in the verification environment to record occurrence of statement coverage events. The coverage bins corresponding to the other lines of the code 702 can be classified as secondary bins, which can have their coverage event records reconstructed from the coverage event record of the primary bin. Since, based on the configuration of the code 702, the records of the coverage bins corresponding to the lines of the code 702 should be equal, the coverage event records for the secondary bins can copy the coverage event record captured by the primary bin in the verification environment.

Referring to FIG. 8, another example coverage bin classification for a portion of a circuit design is shown. The portion of the circuit design can include lines of code 802, for example, written in a hardware description language, which can describe a portion of an electronic device. During simulation or emulation of the electronic device, the code 802 can implement a branch. For example, if during the execution of the top line of the code 802 it is determined that a "condition" is met, the subsequent lines of the code 802 will be executed until the "end" line has been reached. If, however, during the execution of the top line of the code 802 it is determined that the "condition" is not met, execution branches to the "else begin" line of code, and its subsequent lines of the code 802 will be executed until the "end" line has been reached.

For branch coverage, coverage bins 801 can be generated for each executable line of the code 802. During simulation or emulation of the code 802, when the top line of the code 802 is executed and the "condition" is met, resulting in a branch coverage event for that top line of the code 802, a corresponding coverage bin can record the occurrence of the branch coverage event. Since the code 802 is configured such that when the top line of the code 802 results in a branch coverage event, the subsequent lines of the code 802 will be executed until the "end" line has been reached, the coverage bins 801 for those subsequent lines of code need not be implemented to record coverage events in a verification environment. Instead, a coverage bin for the conditional statement can be implemented in the verification environment to record any occurrences of the branch coverage event, while the coverage bins for those subsequent lines of code can have their coverage event records generated from coverage event record of the implemented coverage bin.

During simulation or emulation of the code 802, when the top line of the code 802 is executed and the "condition" is not met, resulting in a branch to the "else begin" line of the code 802, no branch coverage event occurs for that top line of code. Execution continues to the "else begin" line of the code 802, which results in a branch coverage event, the occurrence of which can be recorded in a corresponding coverage bin. Since the code 802 is configured such that when the "else begin" line of the code 802 results in a branch coverage event, the subsequent lines of will be executed until the "end" line has been reached, the coverage bins 801 for those subsequent lines of code need not be implemented to record coverage events in a verification environment. Instead, a coverage bin for the conditional statement can be implemented in the verification environment to record any occurrences of coverage event, while the coverage bins for those subsequent lines of code can have their coverage event records generated from coverage event record of the implemented coverage bin.

In this example, the coverage bin corresponding to the top line of the code 802 can be classified as a primary bin for branch coverage, meaning that it will be implemented in the verification environment to record occurrences of branch coverage events. The coverage bins corresponding to the subsequent lines of the code 802 that will be executed until the "end" line has been reached can be classified as secondary bins, which can have their statement coverage event records reconstructed from the coverage event record of the primary bin associated with the top line of the code 802. Similarly, the coverage bin corresponding to the "else begin" line of the code 802 can be classified as a primary bin for branch coverage, meaning that it will be implemented in the verification environment to record occurrences of branch coverage events. The coverage bins corresponding to the subsequent lines of the code 802 that will be executed until the "end" line has been reached can be classified as secondary bins, which can have their statement coverage event records reconstructed from the coverage event record of the primary bin associated with the "else begin" line of the code 802.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   dividing, by a computing system, coverage bins into primary bins and secondary bins based, at least in part, on a configuration of a circuit design describing an electronic device;
   annotating, by the computing system, the secondary bins with descriptions of how to infer occurrences of coverage events for the secondary bins from the primary bins;
   performing functional verification of the circuit design describing the electronic device modeled in a verification environment, which selectively implements the primary bins with counters in the verification environment to record occurrences of coverage events during the functional verification of the electronic device, while selectively not implementing the secondary bins with the counters in the verification environment; and
   recording, by the computing system, coverage events in the secondary bins that were not implemented with the counters in the verification environment based, at least in part, on the annotations to the secondary bins and the recorded coverage events for the primary bins.

2. The method of claim 1, further comprising generating, by the computing system, at least one coverage metric according to the coverage event records associated with the primary bins and the secondary bins.

3. The method of claim 1, further comprising storing, by the computing system, the recorded coverage events associated with the primary bins and the secondary bins into a coverage database.

4. The method of claim 1, wherein performing functional verification of the electronic device further comprises:
   providing a test stimulus to the electronic device modeled in the verification environment; and
   recording, with the primary bins, the coverage events performed by the electronic device in response to the test stimulus.

5. The method of claim 1, wherein the verification environment is configured to simulate the electronic device described by the circuit design with the computing system or emulate the electronic device described by the circuit design with a hardware emulator.

6. The method of claim 1, wherein dividing the coverage bins into primary bins and secondary bins further comprises:
   identifying relationships between coverage events capable of recordation by the coverage bins based, at least in part, on the configuration of the circuit design describing the electronic device, wherein the relationships are configured to identify how to infer occurrences of the coverage events for the secondary bins from the recorded coverage events of the primary bins; and
   dividing the coverage bins into the primary bins and the secondary bins based on the identified relationships between coverage events capable of recordation by the bins.

7. The method of claim 1, wherein utilizing the primary bins to record coverage events further comprises incrementing counters corresponding to the primary bins in response to the coverage events being performed by the electronic device when modeled in the verification environment.

8. A system comprising:
   a memory system configured to store computer-executable instructions; and
   a computing system, in response to execution of the computer-executable instructions, is configured to:
      divide coverage bins into primary bins and secondary bins based, at least in part, on a configuration of a circuit design describing an electronic device;
      annotate the secondary bins with descriptions of how to infer occurrences of coverage events for the secondary bins from the primary bins, wherein the primary bins record occurrences of coverage events when selectively implemented with counters during functional verification of the electronic device modeled in a verification environment, and wherein the secondary bins are selectively not implemented with the counters in the verification environment; and recording coverage events in the secondary bins that were not implemented with the counters in the verification environment based, at least in part, on the annotations to the secondary bins and the recorded coverage events for the primary bins.

9. The system of claim 8, wherein the computing system, in response to execution of the computer-executable instructions, is further configured to generate at least one coverage metric according to the coverage event records associated with the primary bins and the secondary bins.

10. The system of claim 9, wherein the computing system, in response to execution of the computer-executable instructions, is further configured to store the recorded coverage events associated with the primary bins and the secondary bins into a coverage database.

11. The system of claim 8, wherein the computing system, in response to execution of the computer-executable instructions, is further configured to:
provide a test stimulus to the electronic device modeled in the verification environment; and
record the coverage events associated with the primary bins that were performed by the electronic device in response to the test stimulus.

12. The system of claim 8, wherein the computing system, in response to execution of the computer-executable instructions, is further configured to:
identify relationships between coverage events capable of recordation by the bins based, at least in part, on the configuration of the circuit design describing the electronic device, wherein the relationships are configured to identify how to infer occurrences of the coverage events for the secondary bins from the recorded coverage events of the primary bins; and
divide the bins into the primary bins and the secondary bins based on the identified relationships between coverage events capable of recordation by the bins.

13. The system of claim 8, wherein the computing system, in response to execution of the computer-executable instructions, is further configured to increment counters corresponding to the primary bins in response to the coverage events being performed by the electronic device when modeled in the verification environment.

14. An apparatus comprising at least one computer-readable memory device storing instructions configured to cause one or more processing devices to perform operations comprising:
dividing coverage bins into primary bins and secondary bins based, at least in part, on a configuration of a circuit design describing an electronic device;
annotating the secondary bins with descriptions of how to infer occurrences of coverage events for the secondary bins from the primary bins, wherein the primary bins record occurrences of coverage events when selectively implemented with counters during functional verification of the electronic device modeled in a verification environment, and wherein the secondary bins are selectively not implemented with the counters in the verification environment; and
recording coverage events in the secondary bins that were not implemented with the counters in the verification environment based, at least in part, on the annotations to the secondary bins and the recorded coverage events for the primary bins.

15. The apparatus of claim 14, wherein the instructions are configured to cause one or more processing devices to perform operations further comprising generating at least one coverage metric according to the coverage event records associated with the primary bins and the secondary bins.

16. The apparatus of claim 14, wherein the instructions are configured to cause one or more processing devices to perform operations further comprising storing the recorded coverage events associated with the primary bins and the secondary bins into a coverage database.

17. The apparatus of claim 14, wherein the instructions are configured to cause one or more processing devices to perform operations further comprising:
providing a test stimulus to the electronic device modeled in the verification environment; and
recording the coverage events associated with the primary bins that were performed by the electronic device in response to the test stimulus.

18. The apparatus of claim 14, wherein the verification environment is configured to simulate the electronic device described by the circuit design with the one or more processing devices or emulate the electronic device described by the circuit design with a hardware emulator.

19. The apparatus of claim 14, wherein dividing the coverage bins into primary bins and secondary bins further comprises:
identifying relationships between coverage events capable of recordation by the bins based, at least in part, on the configuration of the circuit design describing the electronic device, wherein the relationships are configured to identify how to infer occurrences of the coverage events for the secondary bins from the recorded coverage events of the primary bins; and
dividing the bins into the primary bins and the secondary bins based on the identified relationships between coverage events capable of recordation by the bins.

20. The apparatus of claim 14, wherein utilizing the primary bins to record coverage events further comprises incrementing the counters corresponding to the primary bins in response to the coverage events being performed by the electronic device when modeled in the verification environment.

* * * * *